United States Patent
Roesler et al.

(10) Patent No.: US 7,999,436 B2
(45) Date of Patent: Aug. 16, 2011

(54) ELECTROACOUSTIC COMPONENT

(75) Inventors: Ulrike Roesler, Hebertshausen (DE); Jaroslaw Konopka, Postetten (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 375 days.

(21) Appl. No.: 12/161,420

(22) PCT Filed: Jan. 24, 2007

(86) PCT No.: PCT/DE2007/000128
§ 371 (c)(1),
(2), (4) Date: Jul. 18, 2008

(87) PCT Pub. No.: WO2007/085237
PCT Pub. Date: Aug. 2, 2007

(65) Prior Publication Data
US 2010/0225201 A1 Sep. 9, 2010

(30) Foreign Application Priority Data
Jan. 26, 2006 (DE) .......................... 10 2006 003 850

(51) Int. Cl.
*H01L 41/09* (2006.01)
(52) U.S. Cl. .................... 310/313 A; 310/365; 310/363
(58) Field of Classification Search .................. 310/358, 310/321, 313, 359, 360, 365, 366, 313 A, 310/328, 311; 333/193, 133, 196, 195; *H01L 41/08*
See application file for complete search history.

(56) References Cited

U.S. PATENT DOCUMENTS

| | | | |
|---|---|---|---|
| 4,328,472 A | 5/1982 | Grudkowski | |
| 5,874,869 A * | 2/1999 | Ueda et al. | 333/193 |
| 6,037,847 A * | 3/2000 | Ueda et al. | 333/193 |
| 6,317,015 B1 | 11/2001 | Ueda et al. | |
| 7,339,304 B2 * | 3/2008 | Kadota et al. | 310/313 A |
| 2006/0076852 A1 * | 4/2006 | Ruile et al. | 310/313 R |

FOREIGN PATENT DOCUMENTS

| | | |
|---|---|---|
| DE | 196 41 662 | 4/1997 |
| EP | 0 920 129 | 12/2006 |
| WO | WO98/52279 | 11/1998 |
| WO | WO2005/034347 | 4/2005 |

OTHER PUBLICATIONS

International Search Report for PCT/DE2007/000128.
Written Opinion for PCT/DE2007/000128.
English translation of Written Opinion for PCT/DE2007/000128.

\* cited by examiner

*Primary Examiner* — Thomas M. Dougherty
*Assistant Examiner* — Karen Addison
(74) *Attorney, Agent, or Firm* — Fish & Richardson P.C.

(57) ABSTRACT

An electroacoustic component that includes a substrate made of monocrystalline $LiNbO_3$ is disclosed. In the component, a first Euler angle $\lambda$ of the monocrystalline $LiNbO_3$ is: $\lambda \approx 0°$, a second Euler angle $\mu$ of the monocrystalline $LiNbO_3$ is: $-74° \leq \mu \leq -52°$ or $23° \leq \mu \leq 36°$, and a third Euler angle $\theta$ of the monocrystalline $LiNbO_3$ is: $\theta \approx 0°$.

20 Claims, 1 Drawing Sheet

ELECTROACOUSTIC COMPONENT

CROSS REFERENCE TO RELATED APPLICATIONS

Pursuant to 35 USC §120, this application claims the benefit PCT/DE2007/000128 filed Jan. 24, 2007 which claims the benefit of German Patent Application No. 102006003850.9 filed Jan. 26, 2006. Each of these applications is incorporated by reference in its entirety.

BACKGROUND

Crystal sections of LiNbO$_3$ single crystals are known from the document DE 196 41 662 B4, among others.

SUMMARY

The problem of the present invention is to specify a component operating with acoustic waves, which, in addition to a low temperature coefficient of frequency (e.g., resonant frequency or center frequency), has lower losses due to undesired wave emission.

A component operating with acoustic waves can comprise, in particular, a resonator with a transducer in which the acoustic wave can be excited. As a rule, a transducer has an electrode grating. The electrodes are metal strips arranged perpendicular to the wave propagation direction. The transducer can be arranged between two acoustic reflectors, which are suitable for localizing the acoustic wave in the active region of the transducer. The component has a passband and at least one stopband.

The specified component can be suitable for exciting surface acoustic waves. The specified component can also be suitable for exciting guided bulk acoustic waves—or GBAW.

A crystal section can be specified by three Euler angles. The Euler angles will be explained below with reference to FIG. 1. The first Euler angle is designated as λ below, the second as μ, and the third as θ.

Depending on the crystal section, a shear wave or a Rayleigh wave can be excited in the monocrystalline LiNbO$_3$. It was found that the electroacoustic coupling constant $K^2$ for the shear wave is essentially zero in the (0°, μ, 0°) crystal section at μ=30°, and at μ=−64° for the Rayleigh wave in the (0°, μ, 0°) crystal section, i.e., the respective wave is not, or only very weakly excited there. The respective differently polarized wave is very strongly excited, however. Due to the crystal symmetry, Euler angles (0°, μ, 0°), (0°, μ+180°, 0°) and (0°, μ−180°, 0°) are equivalent with respect to their acoustic properties.

According to a first embodiment, an electroacoustic component is specified with a substrate made from monocrystalline LiNbO$_3$ for the second Euler angle of which −74°≦μ≦−52°. For the first Euler angle λ: λ=0°. For the third Euler angle θ: θ=0.

An angle that is essentially equal to zero is understood to mean, in particular, an angle range that lies between −5° and +5°. This applies to the angles λ and θ. It can also be For the first Euler angle λ, it is preferred that λ=0°. For the third Euler angle θ, it is preferred that θ=0°. At the interface of the substrate, a horizontally polarized shear wave can be generated, which advantageously represents a GBAW. The horizontal polarization means that the shear wave is essentially polarized in a lateral plane. The angle range in this case is particularly advantageously −67°≦μ≦−61°.

The shear wave primarily comprises a component that is polarized in the X, Y plane essentially perpendicular to the propagation direction X of the wave. A small wave component that is polarized perpendicular to the lateral plane can also be present.

The component preferably has a transducer in which a shear wave can be propagated as the main mode. The transducer is distinguished in that its admittance curve has no secondary resonances below the resonant frequency $f_R$ of the main resonance. The secondary resonances have only a low intensity in the frequency range between $f_R$ and $1.5 f_R$.

According to a second preferred embodiment, an electroacoustic component with a substrate made from a monocrystalline LiNbO$_3$ is specified, for the second Euler angle μ of which 23°≦μ≦36°. For the first Euler angle λ, it is preferred that λ≈0°. For the third Euler angle θ, it is preferred that θ≈0°. In this case, a Rayleigh wave, which represents a GBAW in one advantageous variant, can be excited at the interface of the substrate. The angle range 28°≦μ≦32° is particularly advantageous in this case.

The Rayleigh wave primarily comprises a component that is polarized essentially in the sagittal plane (X, Z) perpendicular to the lateral plane. A small wave component that is polarized perpendicular to the propagation direction X of the wave can also be present.

The component preferably has a transducer in which the Rayleigh wave is capable of propagation as the main mode. The transducer is distinguished in that its admittance curve below the resonant frequency $f_R$ has no secondary resonances at the main resonance.

Exemplary configurations of the component according to the first and second embodiments will be specified below.

A metal layer in which electrodes for exciting an acoustic wave of wavelength $\lambda_0$ are formed is arranged on the substrate. This refers to the wavelength at a frequency that lies in the passband of the component. The electrodes can form a periodic electrode grating of the transducer, with a spacing between two oppositely charged electrodes of half a wavelength as measured in the direction of wave propagation.

The metal layer preferably comprises a W layer, the thickness of which relative to the wavelength is at most 10%, and between 1% and 6.5% in an advantageous variant. In particular, the W layer can have a thickness of 5% relative to the wavelength.

The electrodes can also comprise Al or an Al alloy. For example, they can comprise at least one Al layer, but also additional layers, a Cu layer in particular. The overall height of the electrodes can be up to 10% of the wavelength.

The component can be conceived as a component operating with guided bulk acoustic waves, and then comprises an additional substrate and an intermediate layer that is arranged on the first substrate with the electrodes and is particularly suited as a planarization layer.

The additional substrate can be replaced by at least one cover layer. That which was stated in connection with the additional substrate also applies to the cover layer. The cover layer can comprise several layers of different materials.

It is advantageous if the boundary surface of the intermediate layer facing the additional substrate is planar or has been planarized. Thus, a first layer, which comprises the first substrate, the metal layer and the intermediate layer, can be joined to the second substrate by means of direct wafer bonding.

The metal layer is arranged between the substrate and the intermediate layer. The intermediate layer is arranged between the metal layer and the additional substrate. The propagation speed of the wave is preferably larger in the substrate and in the additional substrate than in the intermediate layer.

The proportion of metallized surface area on the surface of the first substrate in the acoustically active region of the component is preferably between 0.3 and 0.7, but is not limited to this range.

The substrate and the additional substrate each preferably have a thickness of at least $7.5\lambda_0$. The additional substrate can be made of Si, particularly of Si with the crystal section (0°, 0°, 0°).

The temperature coefficient of the frequency f of the electroacoustic component can be described by a Taylor series:

$$df/f = T0 + TCF1 \Delta T + TCF2(\Delta T)^2 + \ldots$$

df is the temperature-induced deviation of the frequency of the component at a temperature difference $\Delta T$. This can be, for instance, the temperature deviation at room temperature or at a specified reference temperature. The coefficient TCF1 preceding the linear term of the series is referred to as the linear temperature coefficient. The coefficient TCF2 preceding the quadratic term of this series is referred to as the quadratic temperature coefficient. The curve df/f ($\Delta T$) is essentially a straight line at a small value of the coefficient TCF2.

The crystal section, the metallization height of the electrodes and the proportion of metallized surface area in the acoustically active region of the component are preferably selected such that the linear temperature coefficient TCF1 is small and preferably essentially equal to zero.

The intermediate layer is preferably made of $SiO_x$ with $1.6 \leq x \leq 2.1$, but can also be selected from a different material. The thickness of the intermediate layer relative to the wavelength is between 20% and 200%. The advantage of such a relatively thick intermediate layer is that relatively low values for the parameter TCF1 can thereby be achieved. In the first embodiment, for example, TCF1=−33 ppm/K for the intermediate layer with the relative layer thickness of 25%, and TCF1=−23 ppm/K for the intermediate layer with the relative layer thickness of 150%. In the component according to the second embodiment, it was determined that TCF1=−35 ppm/K for the intermediate layer with the relative layer thickness of 25%, and TCF1=−20 ppm/K for the intermediate layer with the relative thickness of 150%.

The advantage of a relatively thick intermediate layer is also that a relatively high coefficient of reflection R of the wave at an electrode edge can be achieved. For a short-circuited electrode grating in the component according to the second embodiment, it was determined that R=9.34% for the intermediate layer with the relative layer thickness of 25%, and R=15.07% for the intermediate layer with the relative layer thickness of 150%. The proportion of metallized surface area in the active region of a component was 0.5 in this case. Electrodes were made of W with a relative height of 5%.

It is possible to achieve a relatively high electroacoustic coupling coefficient $K^2$, with $K^2 > 12\%$ for the shear wave in the component according to the first embodiment, and $K^2 > 6\%$ for the Rayleigh wave in the component according to the second embodiment.

With regard to the coupling coefficient K in the component according to the first embodiment, $K^2 = 15.08\%$ was determined for the intermediate layer with the relative layer thickness 25%, and $K^2 = 12.34\%$ was determined for the intermediate layer with the relative layer thickness of 150%, wherein the proportion of metallized surface area in the active region of the component was 0.5.

In the component according to the second embodiment, $K^2 = 7.74\%$ was determined for the intermediate layer with the relative layer thickness 25%, and $K^2 = 6.31\%$ was determined for the intermediate layer with the relative layer thickness of 150%, wherein the proportion of metallized surface area in the active range of the component was 0.5.

DESCRIPTION OF THE DRAWINGS

The component will be explained with reference to schematic figures not drawn to scale. These show.

DETAILED DESCRIPTION

Figure 1:
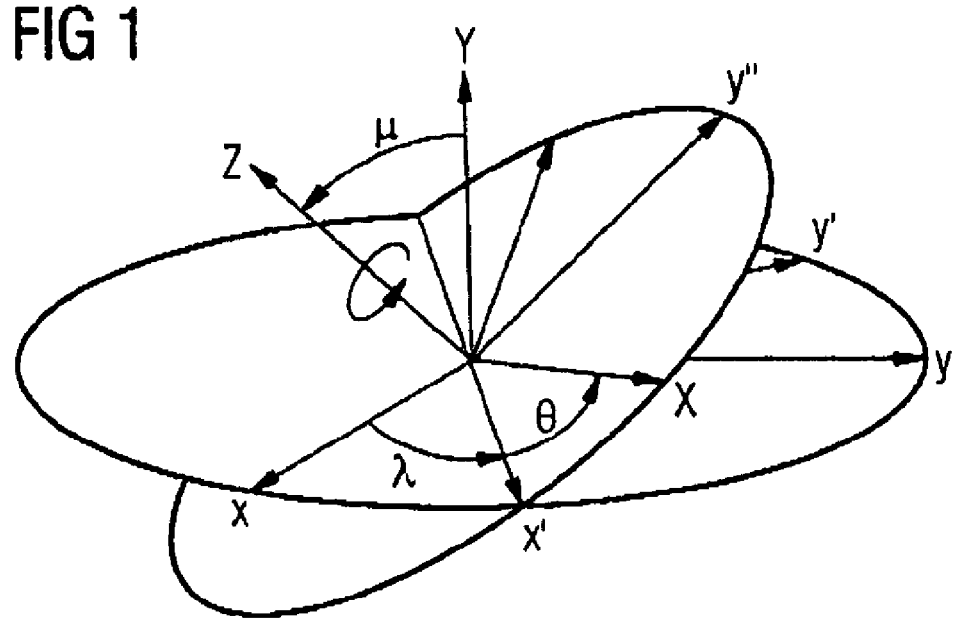
FIG. 1, explanations of the Euler angles for a crystal section.

The Euler angles are explained with reference to FIG. 1. The axes of the crystal-physical coordinate system (x, y, z) are oriented along the crystal axes (a, b, c) of an elementary cell of the single crystal. The first Euler angle $\lambda$ describes a rotation of the coordinate system about the z-axis, see FIG. 1. The once-rotated coordinate system is designated (x', y', z). The second Euler angle $\mu$ describes a rotation of the once-rotated coordinate system about the x'-axis. Then one transitions to the (x', y'', z) coordinate system. The third Euler angle $\theta$ describes a rotation of the twice-rotated coordinate system about the Z-axis. The X-axis of the coordinate system (X, Y, Z) thus obtained is oriented in the direction of propagation of the acoustic wave. The acoustic wave propagates in the X, Y plane, also referred to as the section plane of the substrate. The Z-axis is the normal line to this plane.

Figure 2:
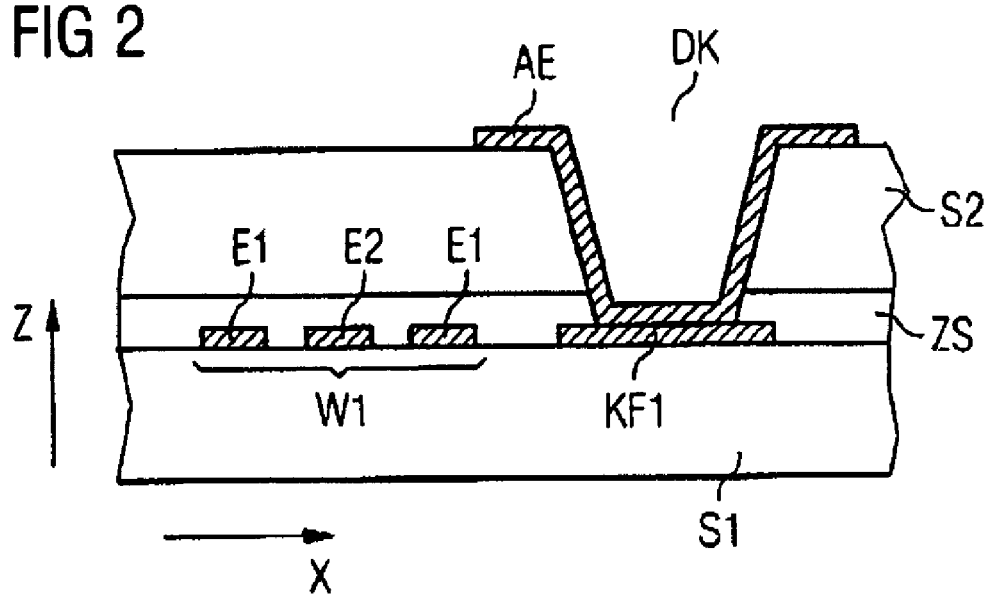
FIG. 2, an exemplary component operating with GBAW.

A cutout of a component with a transducer W1, in which a guided bulk acoustic wave GBAW can be excited, is shown in FIG. 2.

The first substrate is lithium niobate with one of the specified crystal sections. A metallization layer having a transducer W1 and a contact area KF1 connected thereto is arranged on first substrate S1. The transducer comprises electrodes E1, E2, wherein first electrodes E1 and second electrodes E2 are arranged alternately in the wave propagation direction X. They each extend perpendicular to this direction in the lateral plane.

The structures E1, E2, KF1 of the metal layer are covered with an intermediate layer ZS which seals off the surface of first substrate 51 that remains exposed. Intermediate layer ZS is at least as high as this metal layer.

Contact area KF1 can be contacted from the outside by means of a plated through-hole DK through second substrate $S_2$ and intermediate layer ZS. This plated through-hole represents a hole whose surface is covered with a metallization. The metallization lies on top of the exposed surface of second substrate S2 and forms an external contact AE.

The component is not limited to the example shown in FIG. 2.

The invention claimed is:

1. An electroacoustic component configured to operate with guided bulk acoustic waves, comprising:
   a substrate comprising monocrystalline $LiNbO_3$,
   an additional substrate;
   a metal layer on the substrate, the metal layer comprising electrodes for exciting an acoustic wave with a wavelength $\lambda_o$; and
   an intermediate layer between the metal layer and the additional substrate; wherein:
   the metal layer is between the substrate and the intermediate layer;
   a first Euler angle $\lambda$ of the monocrystalline $LiNbO_3$ is: $\lambda \approx 0°$,
   a second Euler angle $\mu$ of the monocrystalline $LiNbO_3$ is: $-74° \leq \mu \leq -52°$, a third Euler angle θ of the monocrystalline LiNbO$_3$ is: θ≈0°; and the thickness of the intermediate layer is between 20% and 200% relative to the wavelength λ$_0$.

2. The component of claim 1, wherein the component is configured such that a horizontally polarized shear wave can be excited in the component.

3. The component of claim 1, wherein the metal layer comprises a W layer having a thickness relative to the wavelength of at most about 10%.

4. The component of claim 1, wherein:
a propagation speed of the bulk acoustic wave in the substrate and in the additional substrate is greater than a propagation speed of the bulk acoustic wave in the intermediate layer.

5. The component of claim 4, wherein the additional substrate comprises Si.

6. The component of claim 4, wherein the substrate and the additional substrate each has a thickness of at least 10λ$_0$.

7. The component of claim 1, wherein the component is configured to operate with guided bulk acoustic waves, and the component further comprises:
a cover layer; and
an intermediate layer, wherein:
the metal layer is between the substrate and the intermediate layer,
the intermediate layer is between the metal layer and the cover layer, and
a propagation speed of the bulk acoustic wave in the substrate and the cover layer is greater than a propagation speed of the bulk acoustic wave in the intermediate layer.

8. The component of claim 1, wherein the intermediate layer comprises SiO$_x$ with $1.6 \leq x \leq 2.1$.

9. The component of claim 8, wherein the intermediate layer comprises SiO$_x$ with $1.95 \leq x \leq 2.05$.

10. The component of claim 1, wherein for the second Euler angle μ: $-67° \leq \mu -61°$.

11. An electroacoustic component configured to operate with guided bulk acoustic waves, comprising:
a substrate comprising monocrystalline LiNbO$_3$,
an additional substrate;
a metal layer on the substrate, the metal layer comprising electrodes for exciting an acoustic wave with a wavelength λ$_o$; and
an intermediate layer;
wherein:
the metal layer is between the substrate and the intermediate layer;
the intermediate layer is between the metal layer and the additional substrate;
a first Euler angle λ of the monocrystalline LiNbO$_3$ is: λ≈0°,
a second Euler angle μ of the monocrystalline LiNbO$_3$ is: $23° \leq \mu 36°$, and
a third Euler angle θ of the monocrystalline LiNbO$_3$ is: θ≈0°; and
the thickness of the intermediate layer is between 20% and 200% relative to the wavelength λ$_0$.

12. The component of claim 11, wherein the component is configured such that a Rayleigh wave can be excited in the component.

13. The component of claim 11, wherein for the second Euler angle μ: $28° \leq \mu 32°$.

14. The component of claim 11, wherein the metal layer comprises a W layer, wherein a thickness of the W layer relative to the wavelength is at most about 10%.

15. The component of claim 11, wherein
a propagation speed of the bulk acoustic wave in the substrate and in the additional substrate is greater than a propagation speed of the bulk acoustic wave in the intermediate layer.

16. The component of claim 15, wherein the intermediate layer comprises SiO$_x$ with $1.6 \leq x \leq 2.1$.

17. The component of claim 16, wherein the intermediate layer comprises SiO$_x$ with $1.95 \leq x \leq 2.05$.

18. The component of claim 15, wherein the additional substrate comprises Si.

19. The component of claim 15, wherein the substrate and the additional substrate each has a thickness of at least 10λ$_0$.

20. The component of claim 11, wherein the component is configured to operate with guided bulk acoustic waves, and the component further comprises:
a cover layer; and
an intermediate layer, wherein:
the metal layer is between the substrate and the intermediate layer,
the intermediate layer is between the metal layer and the cover layer, and
a propagation speed of the bulk acoustic wave in the substrate and the cover layer is greater than a propagation speed of the bulk acoustic wave in the intermediate layer.

* * * * *

UNITED STATES PATENT AND TRADEMARK OFFICE
CERTIFICATE OF CORRECTION

PATENT NO. : 7,999,436 B2  
APPLICATION NO. : 12/161420  
DATED : August 16, 2011  
INVENTOR(S) : Ulrike Roesler, Jaroslaw Konopka and Werner Ruile Page 1 of 1

It is certified that error appears in the above-identified patent and that said Letters Patent is hereby corrected as shown below:

Title Page, item (75), Column 1, Line 2 (inventors) – delete "Postetten" and insert -- Pastetten --, therefor.

Claim 10, Column 5, Line 38 – delete "$-67°\leq\mu-61°$." and insert -- $-67°\leq\mu\leq-61°$. --, therefor.

Claim 11, Column 6, Line 9 – delete "$23°\leq\mu36°$," and insert -- $23°\leq\mu\leq36°$, --, therefor.

Claim 13, Column 6, Line 17 – delete "$28°\leq\mu32°$." and insert -- $28°\leq\mu\leq32°$. --, therefor.

Signed and Sealed this  
Twenty-fifth Day of October, 2011

David J. Kappos  
*Director of the United States Patent and Trademark Office*